(12) United States Patent
Kurd et al.

(10) Patent No.: US 6,469,533 B1
(45) Date of Patent: Oct. 22, 2002

(54) MEASURING A CHARACTERISTIC OF AN INTEGRATED CIRCUIT

(75) Inventors: Nasser A. Kurd, Hillsboro, OR (US);
Keng L. Wong, Portland, OR (US);
Rachael J. Parker, Forest Grove, OR (US); Hung-Piao Ma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/545,922

(22) Filed: Apr. 10, 2000

(51) Int. Cl.[7] ............................................... G01R 31/02
(52) U.S. Cl. ..................... 324/763; 324/158.1
(58) Field of Search ..................... 324/763, 765, 324/768, 769, 158.1; 323/315, 313, 314; 327/543, 537, 538, 545, 546; 331/57, 175, 176

(56) References Cited

U.S. PATENT DOCUMENTS

| | | | | | |
|---|---|---|---|---|---|
| 4,853,654 A | * | 8/1989 | Sakurai | ........................ | 331/57 |
| 5,477,182 A | * | 12/1995 | Huizer | ........................ | 327/261 |
| 5,510,750 A | * | 4/1996 | Cho | ........................... | 327/546 |
| 5,808,476 A | * | 9/1998 | Lee et al. | .................... | 324/765 |
| 5,847,617 A | * | 12/1998 | Reddy et al. | ................. | 331/57 |
| 5,959,446 A | * | 9/1999 | Kuckreja | .................... | 323/315 |
| 6,275,079 B1 | * | 8/2001 | Park | ........................... | 327/143 |

* cited by examiner

Primary Examiner—Michael Sherry
Assistant Examiner—Minh N. Tang
(74) Attorney, Agent, or Firm—Trop, Pruner & Hu, P.C.

(57) ABSTRACT

An integrated circuit includes a first circuit, a second circuit, at least one test pad and multiplexing circuitry. The second circuit is coupled to the first circuit and has substantially the same design as the first circuit to emulate an electrical characteristic of the first circuit. The multiplexing circuitry selectively couples the test pad(s) to the second circuit to selectively measure the electrical characteristic.

32 Claims, 6 Drawing Sheets

US 6,469,533 B1

MEASURING A CHARACTERISTIC OF AN INTEGRATED CIRCUIT

BACKGROUND

The invention relates to measuring a characteristic of an integrated circuit.

Referring to FIG. 1, an integrated circuit (a microprocessor, for example) typically is fabricated on a die 10 of a silicon wafer. Before the die is encased with a packaging encapsulant, the integrated circuit may be tested. In this manner, a conventional technique for testing the integrated circuit may include placing a test probe 14 on a test pad 16 of the circuit and observing some electrical characteristic (a voltage or a current, for example) of the integrated circuit on a tester 12, for example, to evaluate the circuit's performance.

Unfortunately, the probe 14 may introduce an electrical load on the integrated circuit, and this load may change the operating conditions of the integrated circuit. Thus, the signal that is measured by the probe 14 may not be accurate. Furthermore, the above-described probing technique may not be efficient because of the length of preparation time that may be needed, and the technique may require a sophisticated probing skill. Therefore, the success rate and testing throughput of this technique may be very low.

Thus, there is a continuing need for an arrangement that addresses one or more of the problems that are stated above.

DETAILED DESCRIPTION

Figure 1:
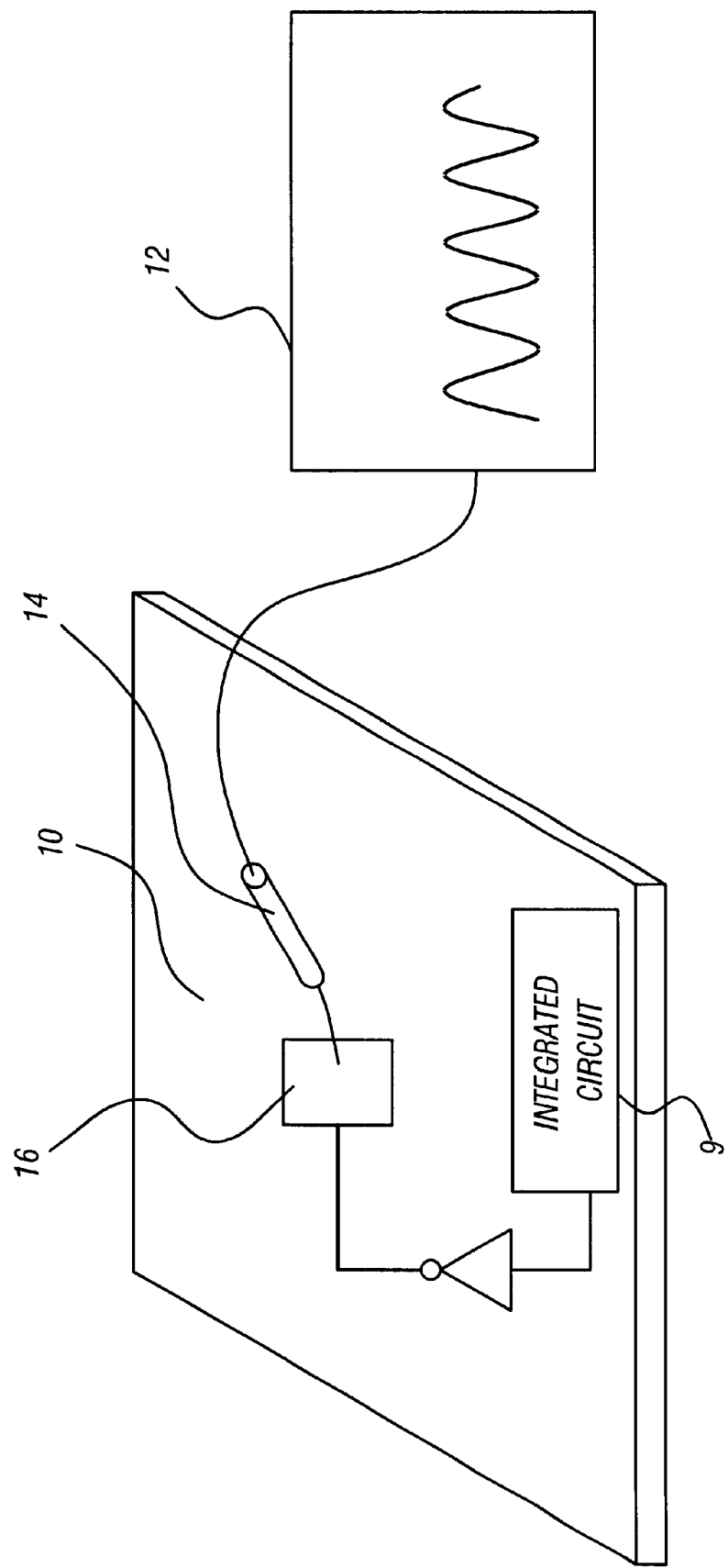
FIG. 1 is a schematic diagram illustrating a technique to measure a characteristic of an integrated circuit of the prior art.
Figure 2:
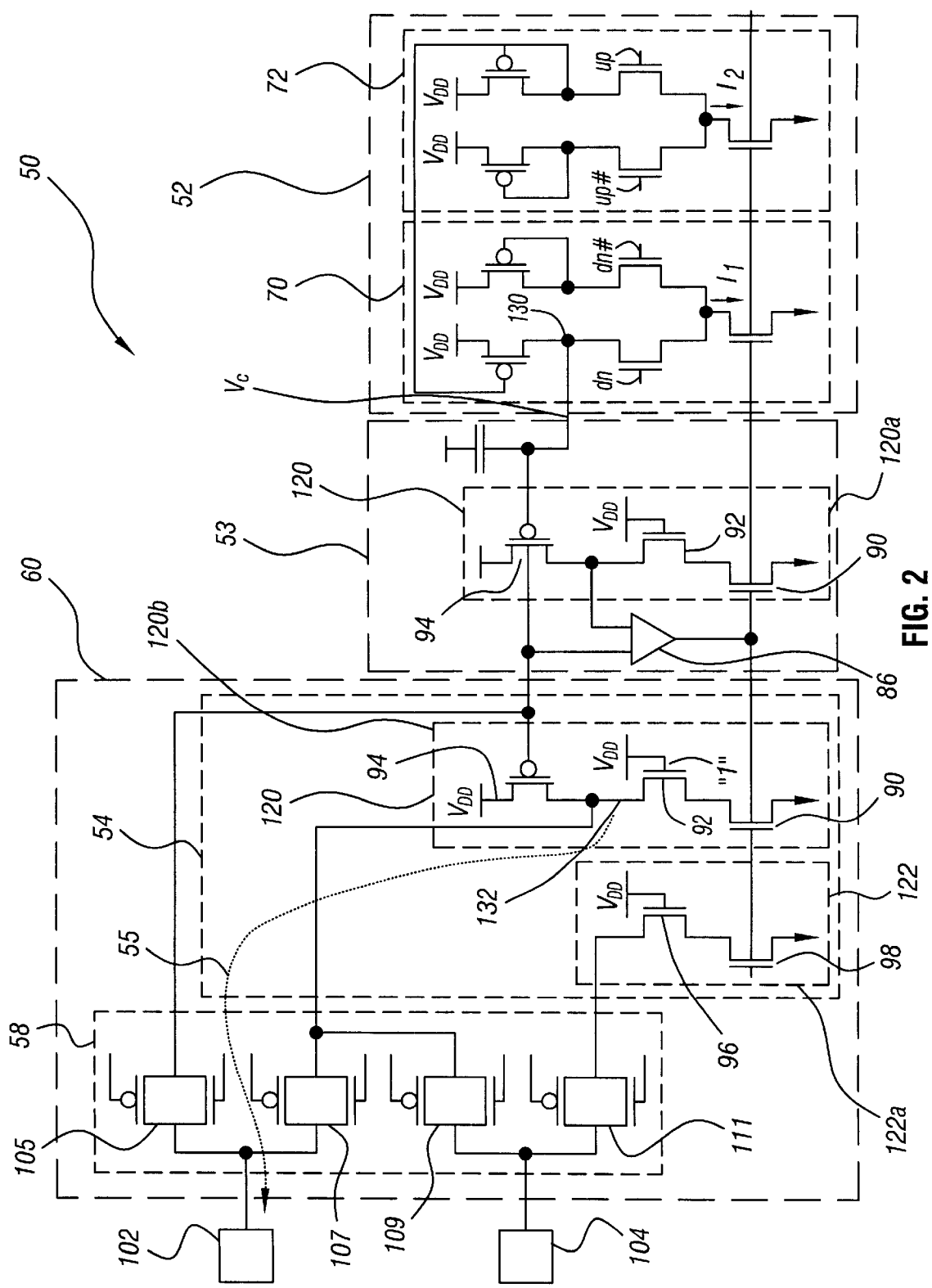
FIGS. 2, 3, 4 and 5 are schematic diagrams of an integrated circuit according to an embodiment of the invention.

Referring to FIG. 2, an embodiment 50 of a very large scale integrated (VLSI) circuit 50 in accordance with the invention includes a test circuit 60 that permits direct and indirect observability and controllability of analog and digital nodes of the integrated circuit 50 without affecting the performance of the circuit 50. This analog and digital observability and controllability permits automated testing and characterization with a production tester and facilitates production screening.

More particularly, in some embodiments of the invention, the test circuit 60 may be used to measure the electrical characteristics (voltages and currents, for example) of a current bias circuit 53 of the integrated circuit 50. The current bias circuit 53 is an exemplary circuit for purposes of illustrating an embodiment of the invention and may replaced by any circuit whose electrical characteristics need to be observed.

As an example in some embodiments of the invention, the current bias circuit 53 may be used to control bias currents in components of a voltage control oscillator (VCO) or an operational amplifier, as examples. The bias circuit 53 that is depicted in FIG. 2 establishes bias currents (called $I_1$ and $I_2$) in a charge pump 52 in response to a control voltage (called $V_c$) that is provided by the charge pump 52. The charge pump 52 may form part of a delay locked loop (DLL), and the $V_c$ voltage may be a control voltage that controls the delay that is introduced by a delay chain of inverters of the DLL as an example. Of course other circuits may be substituted in place of the charge pump 52. The test circuit 60, the bias circuit 53 and the charge pump 52 may be fabricated on the same die.

The test circuit 60 includes a current bias circuit 54 that is designed to emulate, or mimic, one or more electrical characteristics of the bias circuit 53 without disturbing the operation of the circuit 53 during testing, as described below. The circuit 60 also includes analog multiplexing circuitry 58 that may be used to selectively direct currents and voltages between two test pads 102 and 104 and the current bias circuit 54 for purposes of measuring the desired electrical characteristics, as described below.

Both the current bias circuit 53 and the current bias circuit 54 of the test circuit 60 include a bias subcircuit 120 (i.e., a bias subcircuit 120a of the circuit 53 and a bias subcircuit 120b of the circuit 54) of similar design. As described below, the bias circuit 120b is coupled to selectively mirror the currents and voltages of the bias circuit 120a and permit these currents and voltages to be monitored at the test pads 102 and 104 without affecting operation of the bias circuit 53.

More specifically, in some embodiments of the invention, the bias subcircuit 120 (i.e., either the subcircuit 120a or the subcircuit 120b) includes a p-channel metal-oxide-semiconductor field-effect-transistor (PMOSFET) 94 that operates in its linear region to effectively form a resistor. The source terminal of the PMOSFET 94 is coupled to a voltage supply (called $V_{DD}$), the drain terminal of the PMOSFET 94 is coupled to the drain terminal of an n-channel metal-oxide-semiconductor (NMOSFET) 92 and the gate terminal of the PMOSFET 94 receives the $V_c$ voltage from the charge pump 52. The source terminal of the NMOSFET 92 is coupled to the drain terminal of an NMOSFET 90, and the source terminal of the NMOSFET 90 is coupled to ground. The gate terminals of the NMOSFETs 90 of the two subcircuits 120a and 120b are coupled together. The gate terminal of the NMOSFET 92 of the bias subcircuit 120a is coupled to a logic one voltage (the V$DD$ voltage, for example), and the gate terminal of the NMOSFET 92 of the circuit 54 is controlled to select the characteristic of the current bias circuit 53 that is measured, as described below.

The current bias circuits 53 and 54 may have some different features. For example, the bias circuit 53 includes an amplifier 86 that has its input terminals coupled to sense the gate-to-drain voltage of the PMOSFET 94 of the circuit 53, and the output terminal of the amplifier 86 is coupled to the gate terminal of the NMOSFET 90 of the circuit 53 to establish the $I_1$, and $I_2$ currents based on the $V_c$ voltage.

Besides the bias subcircuit 120, the current bias circuit 54 may includes another bias subcircuit 122a (that may not be present in the current bias circuit 53) that is formed from NMOSFETs 96 and 98. The drain terminal of the NMOSFET 96 is coupled to analog multiplexing circuitry 58 of the test circuit 60. The source terminal of the NMOSFET 96 is coupled to the drain terminal of the NMOSFET 98. The gate terminal of the NMOSFET 96 receives a logic one voltage (the $V_{DD}$ voltage, for example). The source terminal of the NMOSFET 98 is coupled to ground, and the gate terminal of the NMOSFET 98 is coupled to the gate terminals of the NMOSFETs 90 of the two bias subcircuits 120a and 120b.

In some embodiments of the invention, the analog multiplexing circuitry 58 may include a complementary metaloxide-semiconductor (CMOS) pass gate 107 that is coupled between the drain terminal of the NMOSFET 92 of the subcircuit 120b and the test pad 102. The analog multiplexing circuitry 58 may also include a CMOS pass gate 105 that is coupled between the gate terminal of the PMOSFET 94 of the bias subcircuit 120b and the test pad 102; a CMOS pass gate 109 that is coupled between the drain terminal of the NMOSFET 94 of the current subcircuit 120b and the test pad 104; and a CMOS pass gate 111 that is coupled between the drain terminal of the NMOSFET 96 of the subcircuit 122a and the test pad 104.

The following examples illustrate different characteristics that may be observed and/or controlled using the test circuit 60. FIG. 2 depicts a configuration in which the Vc voltage is measured at the test pad 102. For this configuration, the CMOS pass gate 107 is activated to conduct and the CMOS pass gates 105, 109 and 111 are de-activated. The gate terminal of the NMOSFET 92 of the subcircuit 120b receives a logic one voltage to place the test circuit 60 in a mode to provide an indication of the $V_c$ voltage to the test pad 102. As noted above, the $V_c$ voltage is one of two voltages that are received by the sense amplifier 86 and thus, may influence the bias currents $I_1$ and $I_2$. For purposes of observing the $V_c$ voltage, the CMOS pass gate 107 is activated to couple the test pad 102 to the drain terminal of the NMOSFET 92 so that an indication of the $V_c$ voltage may be observed and measured (by a test probe, for example) at the test pad 102. As described below, the measurement of the $V_c$ voltage does not disturb operation of the charge pump 52.

As depicted in FIG. 2, in some embodiments of the invention, the $V_c$ voltage is furnished by a node 130 of the charge pump 52. Quite often, the node 130 may be very sensitive to electrical loading, such as the loading that may occur if a test probe is directly coupled to the node 130 to measure the $V_c$ voltage. However, unlike this arrangement, when the gate terminal of the NMOSFET 92 of the subcircuit 120b receives a logic one voltage, the bias circuit 54 establishes a node 132 (at the drain terminal of the NMOSFET 92) that is a virtual $V_c$ node to indicate the $V_c$ voltage. Therefore, potential loading that is introduced at the test pad 102 (by a test probe, for example) does not affect the performance of the charge pump 52, and thus, for this example, the $V_c$ voltage may be precisely measured.

Figure 3:
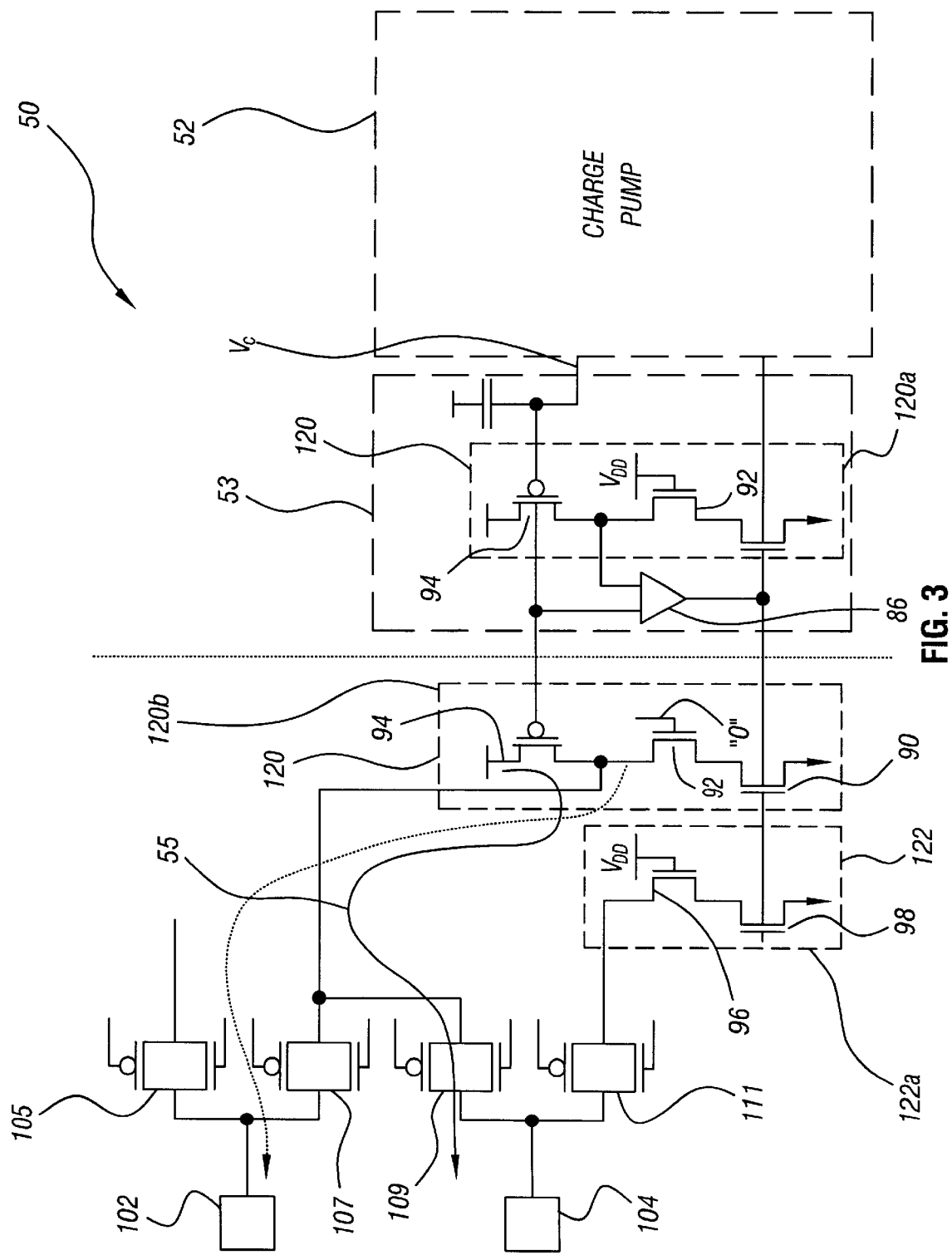

FIG. 3 depicts a configuration to measure the source-to-drain voltage of the NMOSFET 94 of the current bias circuit 53 at the test pad 102 and measure the current in the source-drain path of the NMOSFET 94 of the current bias circuit 53 at the test pad 104. Because the NMOSFET 94 operates in its linear region as a resistor, the current-voltage (I–V) curve characteristic of the NMOSFET 94 may be measured to obtain a measure of the resistance of the drain-source path of the NMOSFET 94 of the current bias circuit 53. As described below, to perform this measurement, the test probes are not directly coupled to the current bias circuit 53. Instead, the test probes are coupled to the bias circuit 54, a circuit that indicates the appropriate current and voltage without loading or otherwise disturbing operation of the current bias circuit 53.

For this configuration, the CMOS pass gates 107 and 109 are activated to conduct, and the CMOS pass gates 105 and 111 are deactivated. Due to their common gate-to-source voltages, the source-to-drain currents are approximately the same for the NMOSFETs 94 of the two current bias circuits 53 and 54. For this configuration, the gate terminal of the NMOSFET 92 of the subcircuit 120b receives a logic zero voltage to prevent current from flowing through the drain-source path of the NMOSFET 92 and permit all of this current to flow through the CMOS pass gate 107 and to the test pad 104 along a path 55. Also for this configuration, the CMOS pass gate 109 is activated to couple the node 132 to the test pad 102 to measure the $V_c$ voltage, as described above. This technique to measure the I–V curve may be quite accurate, since the technique avoids the resistance drop that may occur due to a the resistance that is introduced by the multiplexing circuitry 58 and the various routing wires.

Figure 4:
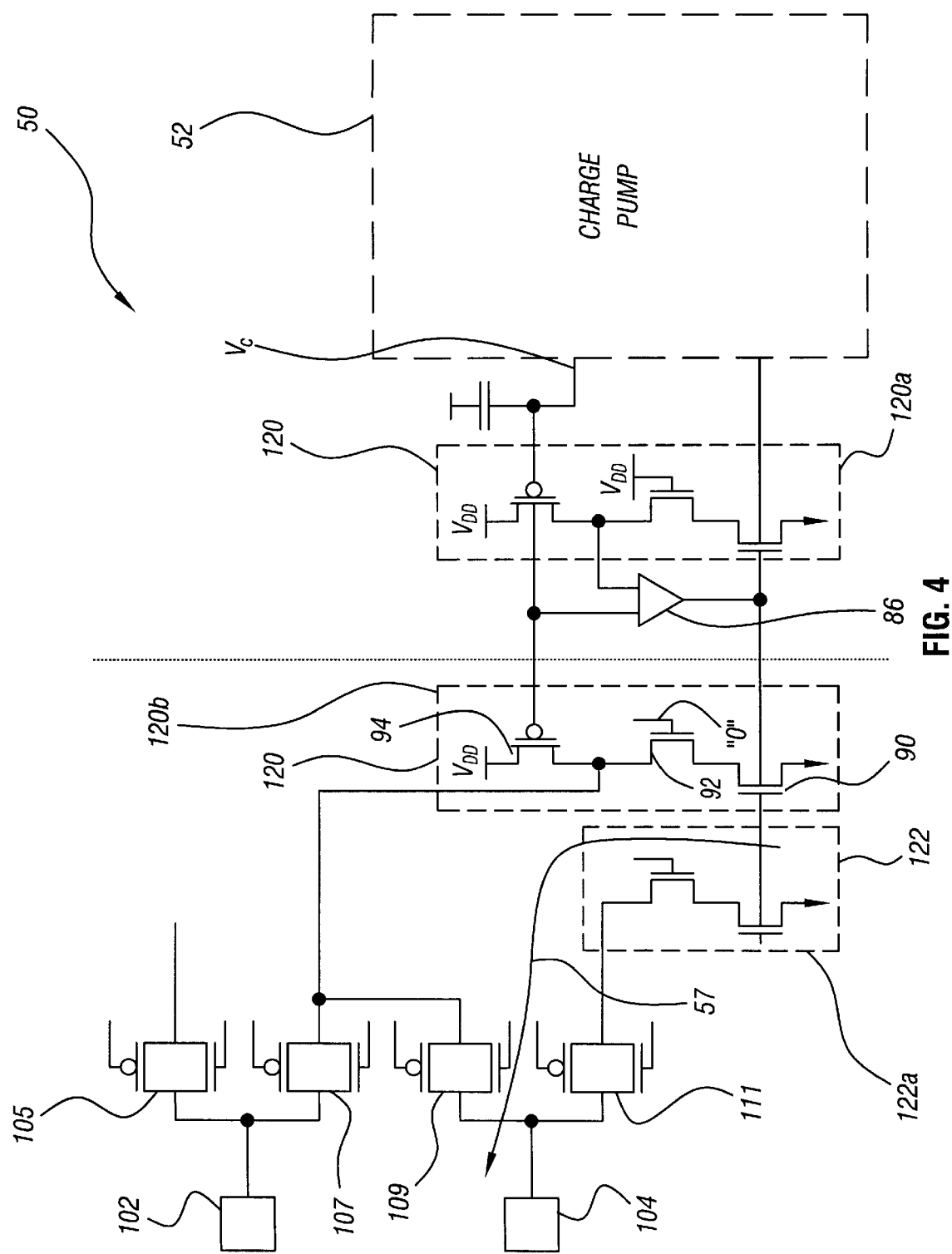

FIG. 4 depicts a configuration of the circuit 60 to measure the bias current $I_1$, $I_2$. To accomplish this, the gate of the NMOSFET 92 of the subcircuit 120b receives a logic zero voltage to cause the NMOSFET 92 not to conduct. The CMOS pass gate 111 is activated to couple the drain terminal of the NMOSFET 96 to the test pad 104 to form a path 57 for routing an indication of the measured bias current to the, test pad 104. The CMOS pass gates 105 and 109 are de-activated for this scenario. The CMOS pass gate 107 is activated to couple the drain of the NMOSFET 96 to the test pad 102 so that a voltage near the $V_{DD}$ power supply level is applied to the drain terminal of the NMOSFET 98. This is an example of measuring the current established by a current source in the die. Often, a bias current that is out of range can be correlated to analog functional marginality.

Figure 5:
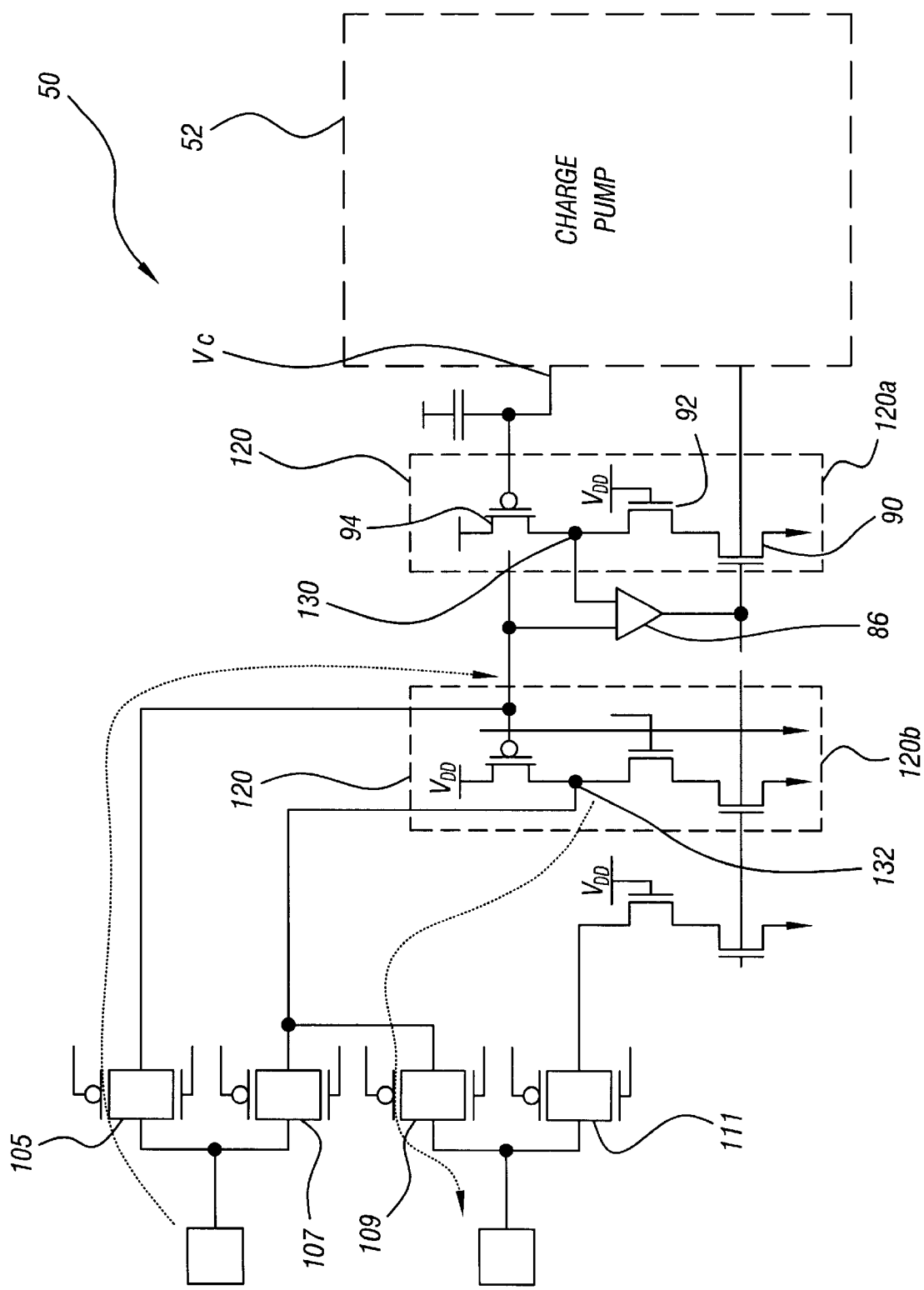
Figure 6:
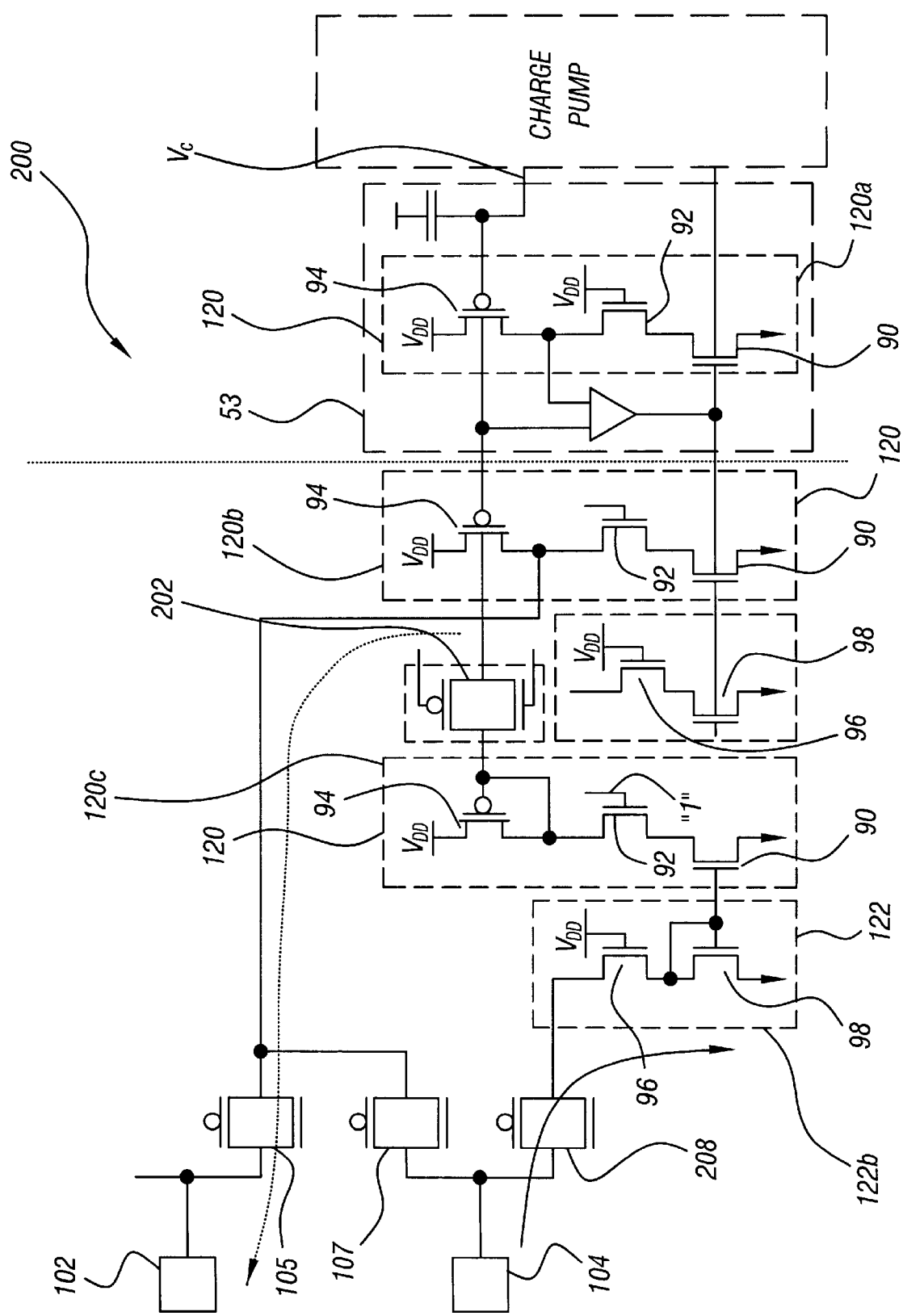
FIG. 6 is a schematic diagram of an integrated circuit according to another embodiment of the invention.

FIG. 5 depicts yet another configuration. In this configuration,the gate terminal of the NMOSFET 92 of the subcircuit 120b receives a logic one voltage to cause the NMOSFET 92 to conduct. The CMOS pass gate 105 is activated to couple the node 130 to the test pad 102 so that a voltage may be applied to the test pad 102 to force the node 130 to a specified voltage. The CMOS pass gate 109 is activated to couple the node 132 to the test pad 104 to effectively measure the voltage of the drain terminal of the NMOSFET 92 of the bias circuit 53. This technique allows direct forcing of the $V_c$ voltage in order to obtain the characteristics of the charge pump 52 when the DLL is not operating in a closed loop. This technique is useful in the event that the DLL is non-functional, as the charge pump 52 may be isolated. For this configuration, the CMOS pass gates 107 and 111 are de-activated.

Other arrangements are possible. For example, in some embodiments of the invention, an integrated circuit 200 may replace the circuit 50. The integrated circuit 200 may be similar in design to the integrated circuit 50 except for the following differences. In particular, the circuit 200 includes an additional bias circuit 120c (of similar design to the biasing circuit 120a and 120b) and an additional bias circuit 122b (of similar design to the biasing circuit 122a). The drain terminal of the PMOSFET 94 of the bias circuit 120c is coupled to its gate terminal. The gate terminal of the PMOSFET 94 of the bias circuit 120c is also coupled to the gate terminals of the PMOSFETs 94 of the bias circuits 120a and 120b. The gate terminal of the NMOSFET 90 of the bias circuit 120c is coupled to the gate terminal of the NMOSFET 98 of the bias circuit 122b, and the drain terminal of the NMOSFET 96 of the bias circuit 122b is coupled by a CMOS pass gate 208 to the test pad 104. The drain terminal of the PMOSFET 96 of the bias circuit 122a may be selectively coupled via a CMOS pass gate (not shown) to one of the test pads 102 and 104.

With the additional bias circuits 122b and 120c, the CMOS pass gate 208 may be activated to couple the test pad 104 to the drain terminal of the NMOSFET 96 of the bias circuit 122a. The gate terminals of the NMOSFETs 92 of the stages 120b and 120c receive logic one voltages. Using this arrangement, current may be applied to the test pad 104 to establish the current in the source-drain paths of the PMOS- FETs 94 of the bias circuits 120a, 120b and 120c. The CMOS pass gate 105 may be activated to couple the test pad 102 to the node 132 to measure the $V_c$ voltage. This example is a variant of the last scenario above, as this examples permits isolated measurement of the $V_c$ voltage while driving the node 130 directly. This buffers the sensitive node 130 from the test pads, thereby rejecting unwanted noise for an accurate measurement.

Other embodiments are within the scope of the following claims. For example, in some embodiments of the invention, bias circuits maybe fabricated next to each other, and the multiplexing circuit may be used to observe the electrical characteristics of the same element (an N-well resistor or a diode, as examples) of these bias circuit. By comparing the electrical characteristics of two adjacent circuits, a determination of how the fabrication process varies within the die. For example, the variations that are observed between two identical N-well resistors, MOSFETs or diodes may be used to determine die variation.

Referring back to FIG. 2, among the other features of the integrated circuit 50, in some embodiments of the invention, the charge pump 52 may include two differential amplifiers 70 and 72 that are coupled together to produce the $V_c$ voltage at a node 130 of the differential amplifier 70 in response to phase error signals (called dn, dn# (the inverse dn signal), up and up# (the inverse up signal)) that are received from a phase comparator (not shown). The bias currents $I_1$ and $I_2$, that are furnished by the current bias circuit 53 establish the bias conditions in the differential amplifiers 70 and 72, respectively, in response to the $V_c$ voltage.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. An integrated circuit comprising:
    a first circuit;
    a second circuit coupled to the first circuit, the second circuit having substantially the same design as the first circuit to emulate different electrical characteristics of the first circuit;
    at least one test pad; and
    multiplexing circuitry to selectively form a first connection between said at least one test pad and the second circuit to indicate one of the electrical characteristics and selectively form a different second connection between said at least one test pad and the second circuit to indicate another one of the electrical characteristics.

2. The integrated circuit of claim 1, wherein the second circuit comprises a bias circuit.

3. The integrated circuit of claim 1, wherein the first circuit comprises a bias circuit.

4. The integrated circuit of claim 1, wherein the second circuit has a first mode to measure said one of the electrical characteristics and a second mode to measure said another one of the electrical characteristics.

5. The integrated circuit of claim 1, wherein one of the electrical characteristics comprises a current of the first circuit mirrored by the second circuit.

6. The integrated circuit of claim 1, wherein one of the electrical characteristics comprises a voltage of the first circuit formed by the second circuit by mirroring a current of the first circuit.

7. The integrated circuit of claim 1, further comprising:
    additional circuits, each additional circuit having substantially the same design as the first circuit to emulate one or more of the electrical characteristics.

8. A method comprising:
    fabricating a first circuit;
    fabricating a second circuit near the first circuit, the second circuit having substantially the same design as the first circuit to emulate different electrical characteristics of the first circuit; and
    selectively forming a first connection between at least one test pad and the second circuit to indicate one of the electrical characteristics; and
    selectively forming a second different connection between said at least one test pad and the second circuit to indicate another one of the characteristics.

9. The method of claim 8, further comprising:
    placing the second circuit in a first mode to measure one of the electrical characteristics.

10. The method of claim 9, further comprising:
    placing the second circuit in a second mode to measure another one of the electrical characteristics.

11. The method of claim 9, wherein one of the electrical characteristics comprises a current of the first circuit mirrored by the second circuit.

12. The method of claim 9, wherein one of the electrical characteristics comprises a voltage of the first circuit formed by the second circuit by mirroring a current of the first circuit.

13. The method of claim 9, further comprising:
    fabricating additional circuits, each additional circuit having substantially the same design as the first circuit to emulate one or more of the electrical characteristics of the first circuit.

14. The method of claim 8, further comprising:
    coupling a node of the second circuit to said at least one test pad to measure a voltage of the first circuit.

15. The method of claim 8, further comprising:
    coupling one of said at least one test pad to a node of the second circuit to measure a voltage of the first circuit; and
    mirroring a current of the second circuit and providing an indication of the mirrored current to another one of said at least one test pad to measure a current of the first circuit.

16. The method of claim 8, further comprising:
    coupling one of said at least one test pad to a node of the second circuit to establish a voltage of the first circuit; and
    coupling another one of at least one test pad to the second circuit to use the second current to measure a current of the first circuit after the establishment of the voltage.

17. The method of claim 8,
    coupling one of said at least one test pad to a node of the second circuit to establish a current in the first circuit; and
    coupling another one of at least one test pad to the second circuit to use the second current to measure a voltage of the first circuit after the establishment of the current.

18. An integrated circuit comprising:
    a first bias circuit;
    a second bias circuit coupled to the first bias circuit, the second bias circuit having substantially the same design as the first bias circuit to emulate different electrical characteristics of the first bias circuit and mirroring at least one current of the first bias circuit;

at least one test pad; and multiplexing circuitry to selectively form a first connection between said at least one test pad and the second circuit to indicate one of the electrical characteristics and selectively form different connections between said at least one test pad and the second circuit to indicate a second different one of the electrical characteristics.

19. The integrated circuit of claim 18, wherein the second circuit comprises a bias circuit.

20. The integrated circuit of claim 18, wherein the first bias circuit comprises a current bias circuit that furnishes the current in response to a voltage.

21. The integrated circuit of claim 18, wherein the second circuit has first mode to measure one of the electrical characteristics and a second mode to measure another one of the electrical characteristics.

22. The integrated circuit of claim 18, wherein one of the electrical characteristics comprises a current of the first bias circuit mirrored by the second circuit.

23. The integrated circuit of claim 18, wherein one of the electrical characteristics comprises a voltage of the first bias circuit formed by the second circuit by mirroring a current of the first circuit.

24. The integrated circuit of claim 18, further comprising:

additional bias circuits, each additional circuit having substantially the same design as the first bias circuit to emulate one or more of the electrical characteristics.

25. An integrated circuit comprising:

a first circuit;

a second circuit coupled to the first circuit, the second circuit having substantially the same design as the first circuit to emulate an electrical characteristic of the first circuit, wherein the electrical characteristic comprises a current of the first circuit mirrored by the second circuit;

at least one test pad; and multiplexing circuitry to selectively form a first connection between said at least one test pad and the second circuit to indicate the electrical characteristic and selectively form a different second connection between said at least one test pad and the second circuit to indicate another electrical characteristic.

26. The integrated circuit of claim 25, wherein the second circuit comprises a bias circuit.

27. The integrated circuit of claim 25, wherein the first circuit comprises a bias circuit.

28. The integrated circuit of claim 25, wherein the second circuit has a first mode to measure the electrical characteristic and a second mode to measure another electrical characteristic of the first circuit.

29. An integrated circuit comprising:

a first circuit;

a second circuit coupled to the first circuit, the second circuit having substantially the same design as the first circuit to emulate an electrical characteristic of the first circuit, wherein the electrical characteristic comprises a voltage of the first circuit formed by the second circuit by mirroring a current of the first circuit;

at least one test pad; and multiplexing circuitry to selectively form a first connection between said at least one test pad and the second circuit to indicate the electrical characteristic and selectively form a different second connection between said at least one test pad and the second circuit to indicate another electrical characteristic.

30. The integrated circuit of claim 29, wherein the second circuit comprises a bias circuit.

31. The integrated circuit of claim 29, wherein the first circuit comprises a bias circuit.

32. The integrated circuit of claim 29, wherein the second circuit has a first mode to measure the electrical characteristic and a second mode to measure another electrical characteristic of the first circuit.

* * * * *